(12) United States Patent
Li et al.

(10) Patent No.: US 8,321,746 B2
(45) Date of Patent: Nov. 27, 2012

(54) SYSTEMS AND METHODS FOR QUASI-CYCLIC LDPC CODE PRODUCTION AND DECODING

(75) Inventors: Zongwang Li, San Jose, CA (US); Hao Zhong, Milpitas, CA (US); Yang Han, Santa Clara, CA (US); Kiran Gunnam, San Jose, CA (US); Shaohua Yang, Santa Clara, CA (US); Yuan Xing Lee, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 668 days.

(21) Appl. No.: 12/512,257

(22) Filed: Jul. 30, 2009

(65) Prior Publication Data

US 2011/0029835 A1  Feb. 3, 2011

(51) Int. Cl.
*H03M 13/00* (2006.01)
(52) U.S. Cl. .............................. 714/752; 714/758
(58) Field of Classification Search .................. 714/752, 714/758
See application file for complete search history.

(56) References Cited

U.S. PATENT DOCUMENTS

| | | | |
|---|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Kawatani et al. |
| 6,748,034 B2 | 6/2004 | Hattori et al. |

(Continued)

FOREIGN PATENT DOCUMENTS

WO  WO 2006/016751  2/2006

(Continued)

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Sam Rizk
(74) *Attorney, Agent, or Firm* — Hamilton DeSanctis & Cha

(57) ABSTRACT

Various approaches related to systems and methods for LDPC based data processing.

20 Claims, 14 Drawing Sheets

U.S. PATENT DOCUMENTS

| | | | |
|---|---|---|---|
| 6,757,862 B1 | 6/2004 | Marianetti, II | |
| 6,788,654 B1 | 9/2004 | Hashimoto et al. | |
| 6,810,502 B2 | 10/2004 | Eidson | |
| 6,986,098 B2 | 1/2006 | Poeppelman et al. | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,093,179 B2 | 8/2006 | Shea | |
| 7,184,486 B1 | 2/2007 | Wu et al. | |
| 7,191,378 B2 | 3/2007 | Eroz et al. | |
| 7,203,887 B2 | 4/2007 | Eroz et al. | |
| 7,257,764 B2 | 8/2007 | Suzuki et al. | |
| 7,310,768 B2 | 12/2007 | Eidson et al. | |
| 8,103,931 B2* | 1/2012 | Wang et al. | 714/755 |
| 2004/0098659 A1 | 5/2004 | Bjerke et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0140311 A1 | 6/2006 | Ashley et al. | |
| 2006/0168493 A1 | 7/2006 | Song | |
| 2006/0195772 A1 | 8/2006 | Graef et al. | |
| 2006/0248435 A1 | 11/2006 | Haratsch | |
| 2007/0011569 A1 | 1/2007 | Casado et al. | |
| 2007/0047635 A1 | 3/2007 | Stojanovic et al. | |
| 2007/0286270 A1 | 12/2007 | Huang et al. | |
| 2008/0028274 A1* | 1/2008 | Lin | 714/752 |
| 2008/0049825 A1 | 2/2008 | Chen et al. | |
| 2008/0168330 A1 | 7/2008 | Graef et al. | |
| 2010/0153811 A1* | 6/2010 | Kwon et al. | 714/752 |
| 2010/0257425 A1* | 10/2010 | Yue et al. | 714/752 |

FOREIGN PATENT DOCUMENTS

| | | |
|---|---|---|
| WO | WO 2006/091797 | 8/2007 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v.43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. On Circuits, Regular Papers, vol. 5, No. 4, pp. 766-775, Apr. 2005.

* cited by examiner

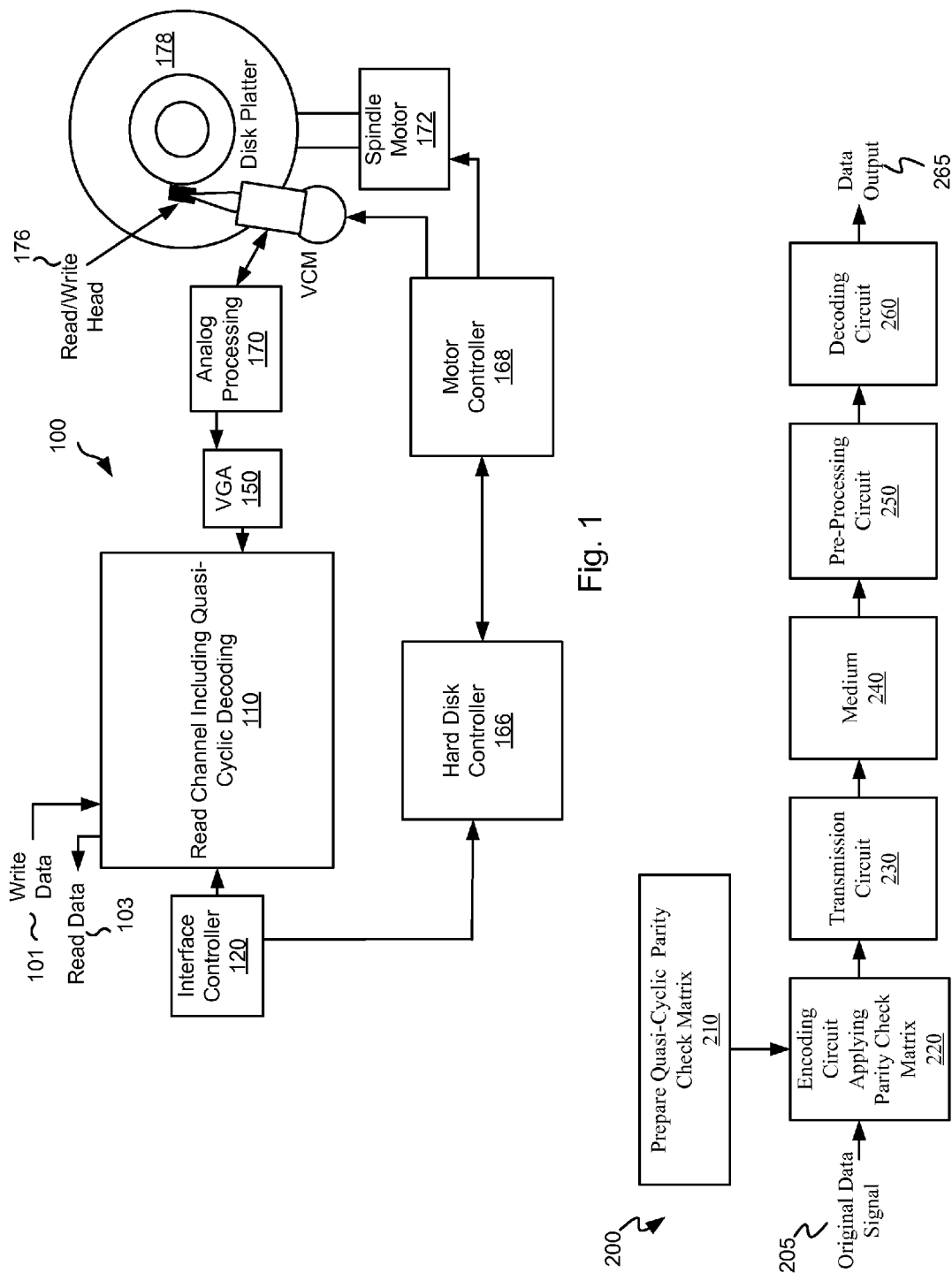

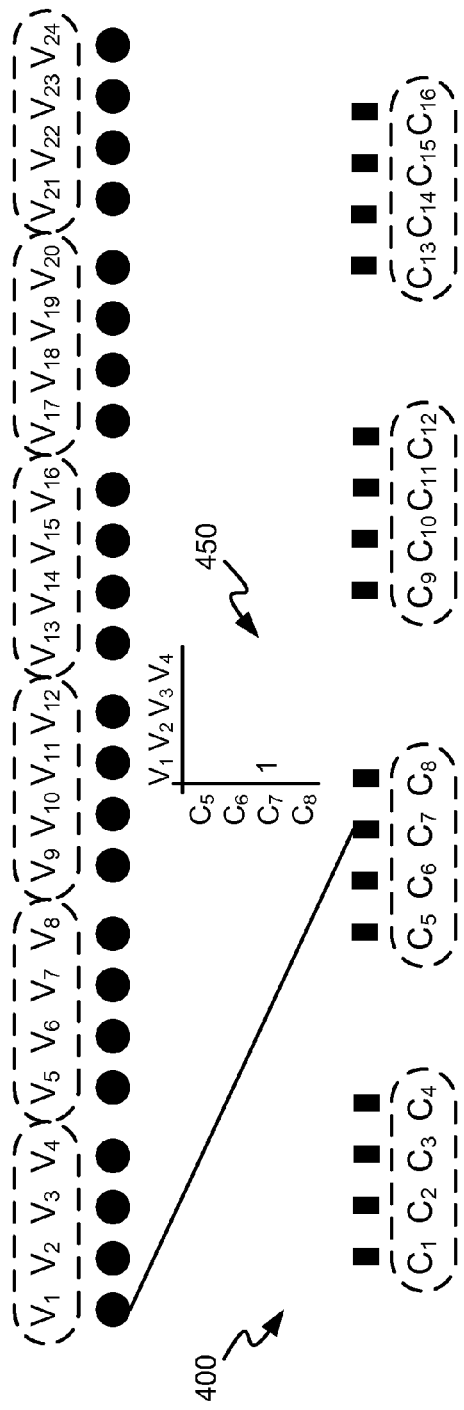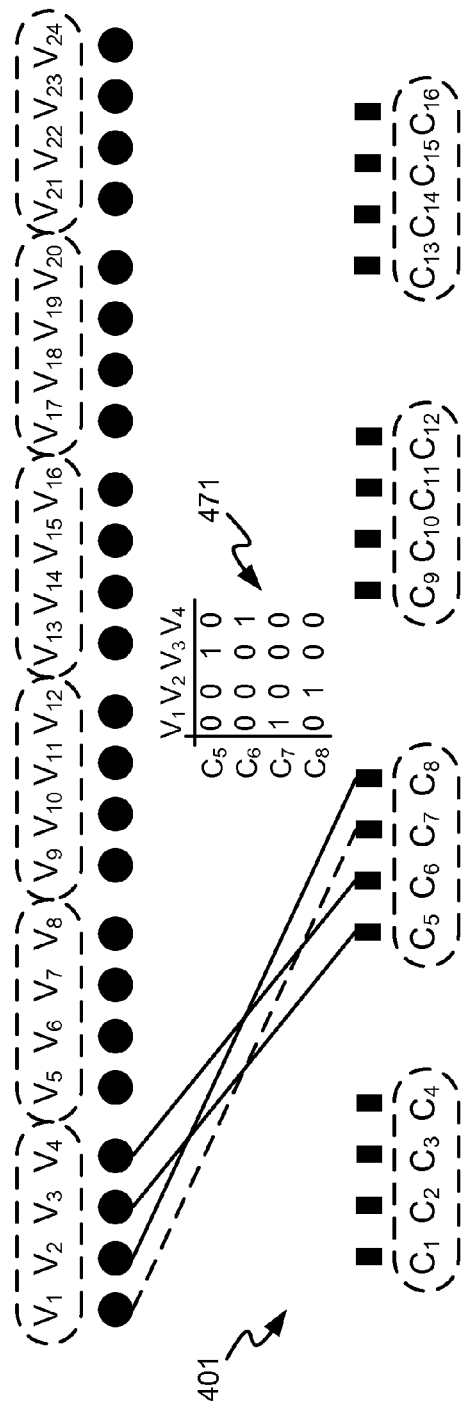
Fig. 4a
Fig. 4b

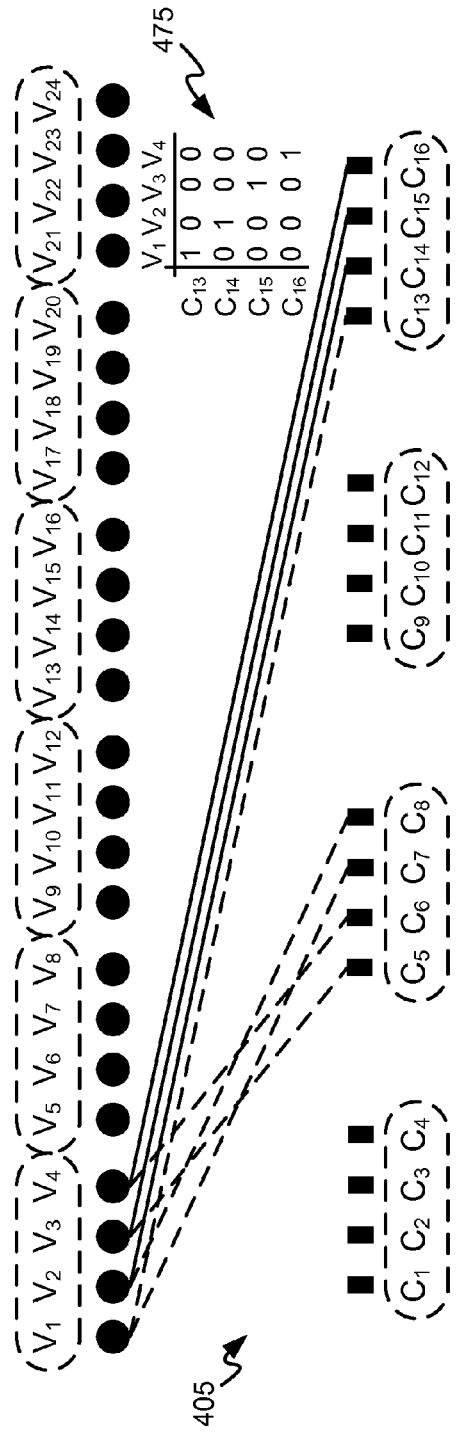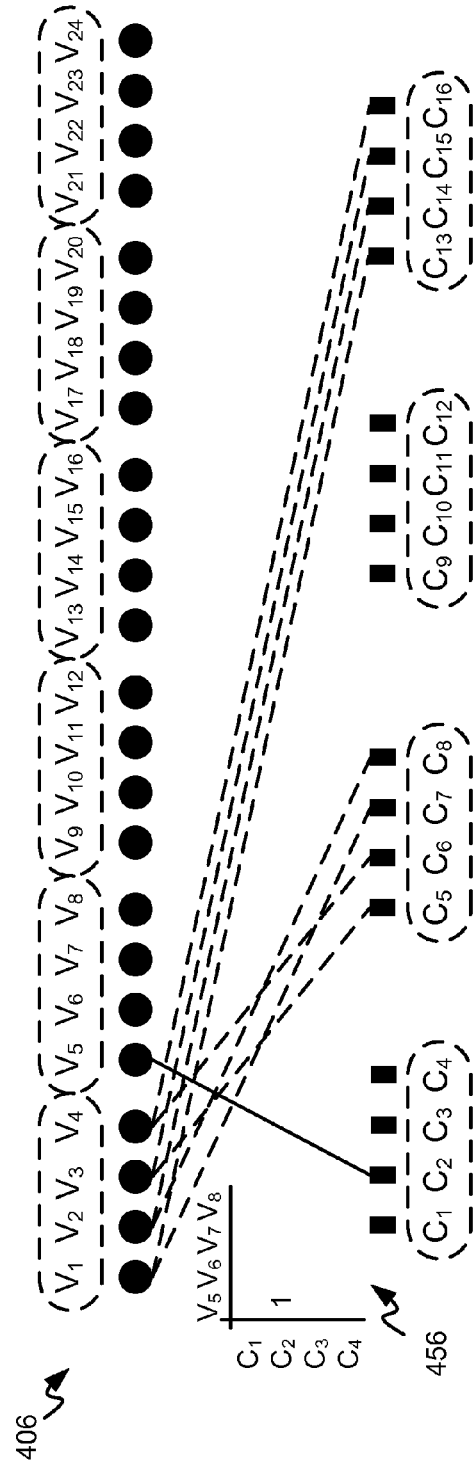
Fig. 4e
Fig. 4f

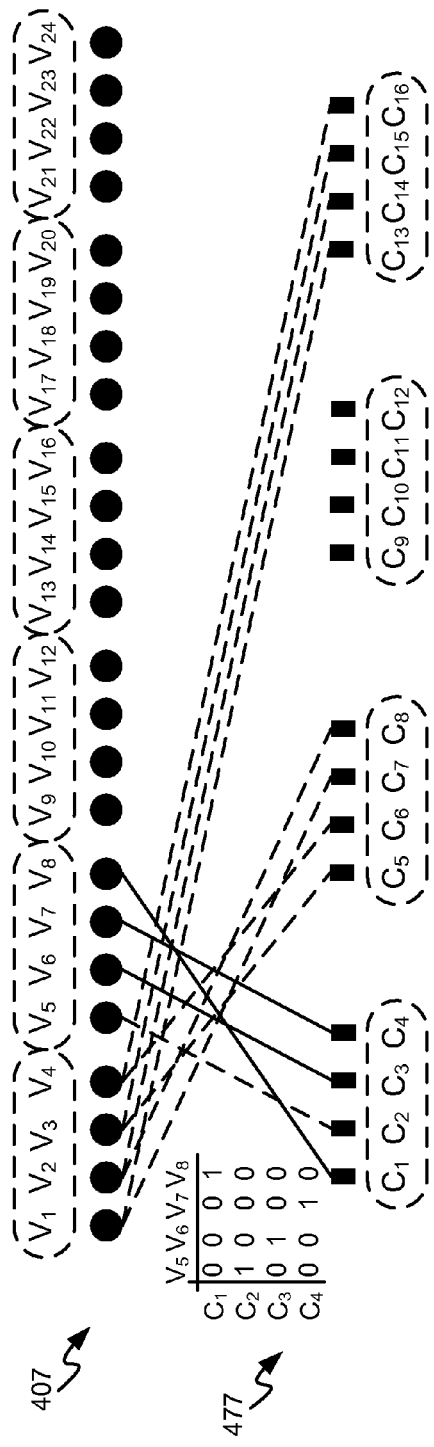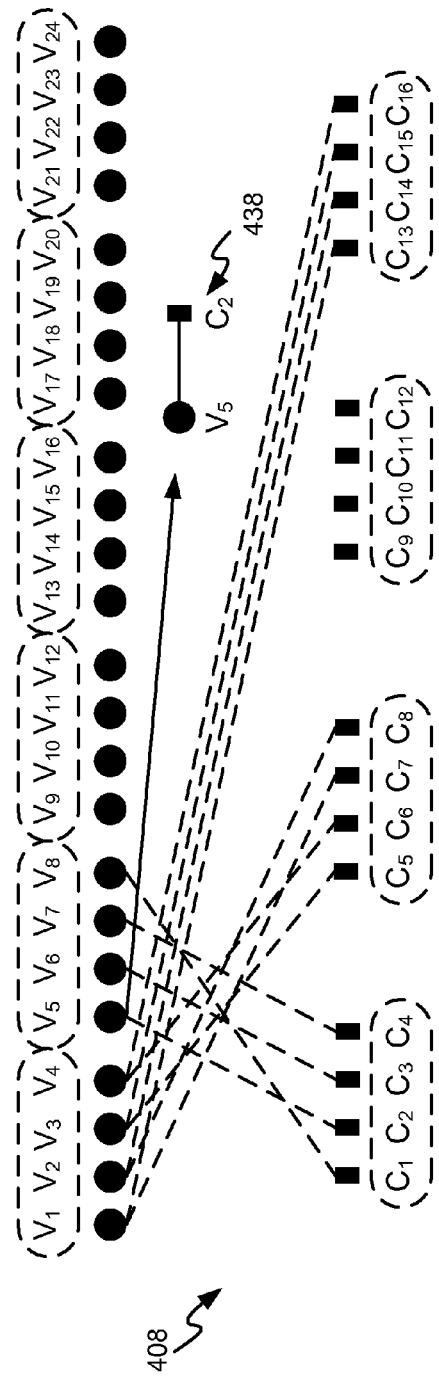
Fig. 4g
Fig. 4h

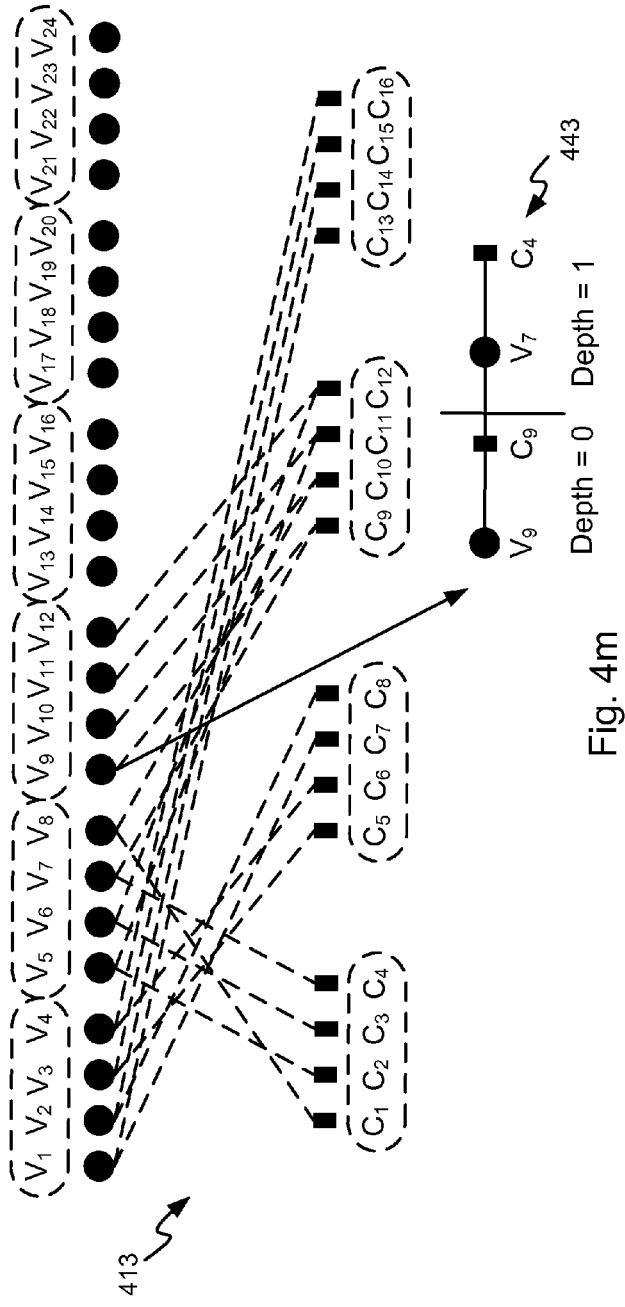
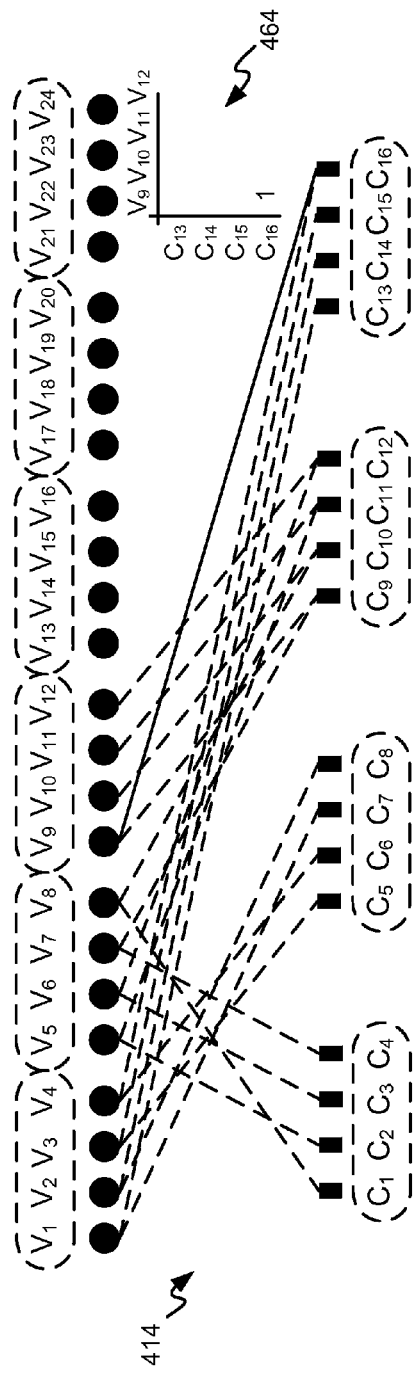
Fig. 4m
Fig. 4n

US 8,321,746 B2

SYSTEMS AND METHODS FOR QUASI-CYCLIC LDPC CODE PRODUCTION AND DECODING

BACKGROUND OF THE INVENTION

The present inventions are related to systems and methods for data processing, and more particularly to LDPC based data processing.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In such systems, errors are introduced to the data during the transmission and recovery processes. In some cases, such errors can be detected by applying encoding/decoding techniques such as low density parity check encoding/decoding. In some cases such encoding/decoding techniques may require complex and power intense functionality. Further, in some cases, errors may be introduced by the encoding/decoding techniques in the form of trapping sets.

Hence, there exists a need in the art for advanced systems and methods for error correction in data processing systems.

BRIEF SUMMARY OF THE INVENTION

The present inventions are related to systems and methods for data processing, and more particularly to LDPC based data processing.

Various embodiments of the present invention provide methods for data processing that include generating a parity check matrix including selecting a non-affiliated variable node; identifying a check node of the lowest degree; connecting a first edge of the non-affiliated variable node to the identified check node; and connecting one or more additional edges of the non-affiliated variable node to check nodes in accordance with a quasi-cyclic constraint associated with a circulant.

In some instances of the aforementioned embodiments, the parity check matrix is a G-matrix and the methods further include providing the G-matrix to an encoding circuit; and matrix multiplying the G-matrix by a user data set in the encoding circuit to yield a codeword. In other instances of the aforementioned embodiments, the parity check matrix is an H-matrix and wherein the methods further include providing a decoding circuit; receiving a codeword; and decoding the codeword. In such cases, decoding the codeword includes matrix multiplying the H-matrix by the user data set in the decoding circuit.

In one or more instances of the aforementioned embodiments, the circulant is a first circulant and the methods further include generating a tree from the non-affiliated variable node to determine a second circulant to be associated with the non-affiliated node. In some such cases, the methods further include identifying a check node of the second circulant having the lowest degree; and connecting the identified check node to the non-affiliated variable node. In various cases, the methods further include connecting one or more additional edges of the non-affiliated variable node to other check nodes of the second circulant in accordance with a quasi-cyclic constraint associated with the second circulant.

In some cases, the non-affiliated variable node is one of a number of variable nodes, and the methods further include applying trapping set mitigation to the connections between the variable nodes and the check nodes, identifying path lengths associated with the connections between the variable nodes and the check nodes, selecting one or more short path lengths between the variable nodes and the check nodes, and reconnecting the one or more short path lengths to yield longer path lengths.

Other embodiments of the present invention provide systems for generating a trapping set reduced parity check matrix. Such systems include a processor that is communicably coupled to a computer readable medium. The computer readable medium includes instructions executable by the processor to: select a non-affiliated variable node; identify a check node of the lowest degree; connect a first edge of the non-affiliated variable node to the identified check node; and connect one or more additional edges of the non-affiliated variable node to check nodes in accordance with a quasi-cyclic constraint associated with a circulant.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 shows a storage system including a read channel module that includes quasi-cyclic encoding/decoding and trapping set mitigation in accordance with one or more embodiments of the present invention;

FIG. 2 depicts a data is a data processing system relying on quasi-cyclic decoding in accordance with various embodiments of the present invention;

DETAILED DESCRIPTION OF THE INVENTION

Figure 3:
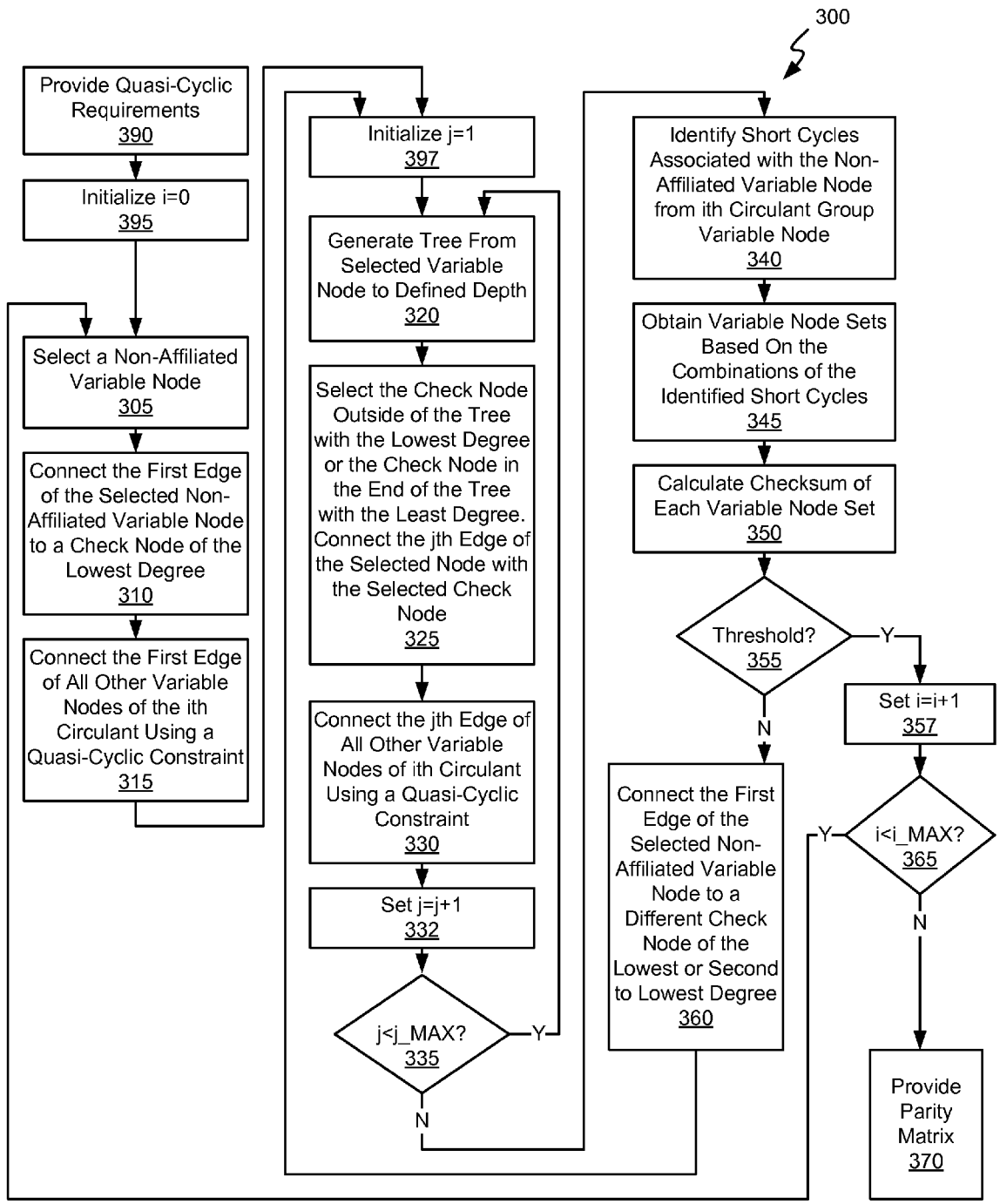
FIG. 3 is a flow diagram depicting a method in accordance with some embodiments of the present invention for quasi cyclic parity matrix construction.

The present inventions are related to systems and methods for data processing, and more particularly to LDPC based data processing.

Turning to FIG. 1, a storage system 100 including read channel circuit 110 that includes quasi-cyclic encoding/decoding and trapping set mitigation in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

Turning to FIG. 2, a data processing system 200 relying on quasi-cyclic decoding is shown in accordance with various embodiments of the present invention. Data processing system 200 includes an encoding circuit 220 that applies a parity check matrix to an original input 205. Original input 205 may be any set of input data. For example, where data processing system 200 is a hard disk drive, original input 205 may be a data set that is destined for storage on a storage medium. In such cases, a medium 240 of data processing system 200 is a storage medium. As another example, where data processing system 200 is a communication system, original input 205 may be a data set that is destined to be transferred to a receiver via a transfer medium. Such transfer mediums may be, but are not limited to, wired or wireless transfer mediums. In such cases, a medium 240 of data processing system 200 is a transfer medium. The parity check matrix is received from a block 210 that generates a quasi-cyclic parity check matrix based upon various input constraints. Generation of the parity check matrix is discussed below in relation to FIGS. 3-5. The encoding applied by encoding circuit 220 is low density parity check encoding constrained by the generated parity check matrix as is known in the art constrained by the generated parity check matrix.

Encoding circuit 220 provides a codeword (i.e., original input encoded using the parity check matrix) 225 to a transmission circuit 230. Transmission circuit 230 may be any circuit known in the art that is capable of transferring the received codeword 225 via medium 240. Thus, for example, where data processing circuit 200 is part of a hard disk drive, transmission circuit 230 may include a read/write head assembly that converts an electrical signal into a series of magnetic signals appropriate for writing to a storage medium. Alternatively, where data processing circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output 235 to medium 240. Medium 240 provides a transmitted input 245 that is transmission output 235 augmented with one or more errors introduced by the transference across medium 240.

Data processing circuit 200 includes a pre-processing circuit 250 that applies one or more analog functions to transmitted input 245. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 250 provides a pre-processed output 255 to a decoding circuit 260. Decoding circuit 260 includes a low density parity check decoder that is capable of decoding the encoded data incorporating the generated parity check matrix. Decoding circuit 260 provides a data output 265. Of note, the parity check matrix used in encoding circuit 220 is often referred to as the generation matrix or G-matrix, and is the inverse of the parity check matrix used in decoding circuit 260 that is often referred to as the H-matrix. Both the H-matrix and G-matrix are pre-constructed using the processes described below in relation to FIGS. 3-5.

Turning to FIG. 3, a flow diagram 300 depicts a method in accordance with some embodiments of the present invention for quasi cyclic parity matrix construction. Following flow diagram 300, a set of quasi-cyclic requirements are provided (block 390). Such quasi-cyclic requirements include identifying the number of variable nodes and check nodes to be utilized in a generated parity matrix. In addition, the variable degree, the check degree and the circulant size are indicated. The circulant size corresponds to the size of sub-matrices within the generated parity matrix that will be used. As an example, twenty-four variable nodes, sixteen check nodes, a variable degree of two, a check degree of three, and a 4×4 circulant size may be requested. Where a 4×4 circulant size is requested and the overall matrix is 24×16 (i.e., the number of variable nodes by the number of check nodes), twenty-four total circulants are included. In some embodiments of the present invention, the processes of flow diagram 300 are implemented with machine executable instructions. The machine executable instructions may be maintained on a computer readable medium that is accessible by a computer processor. The computer processor is capable of accessing the machine executable instructions from the computer readable medium, and executing the machine executable instructions to yield the generated parity check matrix. The generated parity matrix (both a G-matrix and an H-matrix) may then be provided to a data processing system where it is used in relation to both data encoding and data decoding.

A circulant index counter, i, is initialized to zero (block 395). The first variable node of the ith circulant group that has not been previously affiliated with one or more check nodes is selected (block 305). A first edge of the selected, non-affiliated variable node is connected with a check node of the lowest degree (block 310). The check node of the lowest degree is one of the check nodes that has been affiliated with the fewest number of variable nodes. Thus, on the first pass, any of the check nodes may be selected. As the process continues, fewer and fewer of the available check nodes are capable of satisfying the lowest degree requirement. Once the selected, non-affiliated variable node is connected, the other variable nodes associated with the ith circulant group are also connected in accordance with a quasi-cyclic constraint (block 315). As an example, where a 3×3 circulant is used and the 1,1 position is used to connect the selected, non-affiliated variable node, the following quasi-cyclic constraint is used:

$$\begin{bmatrix} 1 & 0 & 0 \\ 0 & 1 & 0 \\ 0 & 0 & 1 \end{bmatrix}.$$

As another example, where the same 3×3 circulant is used and the 2,1 position is used to connect the selected, non-affiliated variable node, the following quasi-cyclic constraint is used:

$$\begin{bmatrix} 0 & 0 & 1 \\ 1 & 0 & 0 \\ 0 & 1 & 0 \end{bmatrix}.$$

As yet another example, where the same 3×3 circulant is used and the 2,3 position is used to connect the selected, non-affiliated variable node, the following quasi-cyclic constraint is used:

$$\begin{bmatrix} 0 & 1 & 0 \\ 0 & 0 & 1 \\ 1 & 0 & 0 \end{bmatrix}.$$

As will be noted by one of ordinary skill in the art, where the first connection is identified, the connections of the other variable nodes in the same circulant group become deterministic. In particular, where the connection in row one is in a position x, the connection in row two will be in a position x+1. Where position x+1 is greater than the number of columns, then the connection is made in the first column. It should be noted that circulants of a size other than 3×3 may be used in accordance with different embodiments of the present invention.

An edge index counter, j, is initialized to be equal to one (block 397). A tree from the selected, non-affiliated variable node is created to determine another check node to which the variable node is to be connected (block 320). The tree is built by identifying all of the connections to the selected, non-affiliated variable node. Selection of another check node is done by selecting one of the check nodes that is not included in the tree or the check node in the top of the tree with the lowest degree if there is no check node that is not included in the tree (i.e., no check node outside of the tree) (block 325). Once the selected, non-affiliated variable node is connected, the other variable nodes associated with the ith circulant are also connected in accordance with a quasi-cyclic constraint (block 330).

The edge index counter is incremented (block 332). It is then determined whether there are edges that remain to be connected by comparing the value of the edge index counter with a maximum count value (block 335). Where additional edges remain to be connected (block 335), the processes of blocks 320-335 are repeated for the next selected variable node. Alternatively, where no edges remain to be connected (block 335), an attempt to reduce any trapping sets is performed. In particular, short cycles associated with each check node are identified (block 340). The variable node sets associated with each of the identified short cycles are obtained (block 345), and check sums for each of the variable node sets are calculated (block 350). The checksums and the number of the variable nodes in the variable node sets are compared to a threshold value (block 355). Where the checksum and the number of the variable nodes are below the threshold value (block 355), trapping set mitigation is performed by trying a different connection (block 360). Such trapping set mitigation may include, for example, re-processing one or more connections using the processes discussed above in relation to blocks 320-335. Otherwise, when the checksum and the number of the variable nodes does not exceed the threshold value (block 355), the circulant index counter is incremented (block 357). It is then determined whether there are circulants that remain to be connected by comparing the circulant index counter value with a known maximum number of circulants (block 365). If all circulants are connected (i.e., i=i_MAX), the parity matrix is provided (block 370) for use in relation to the low density parity check decoding and encoding. Alternatively, where circulants remain to eb connected (i.e., i<i_MAX), blocks 305-355 are repeated for the variable nodes in the ith circulant.

Figure 4C:
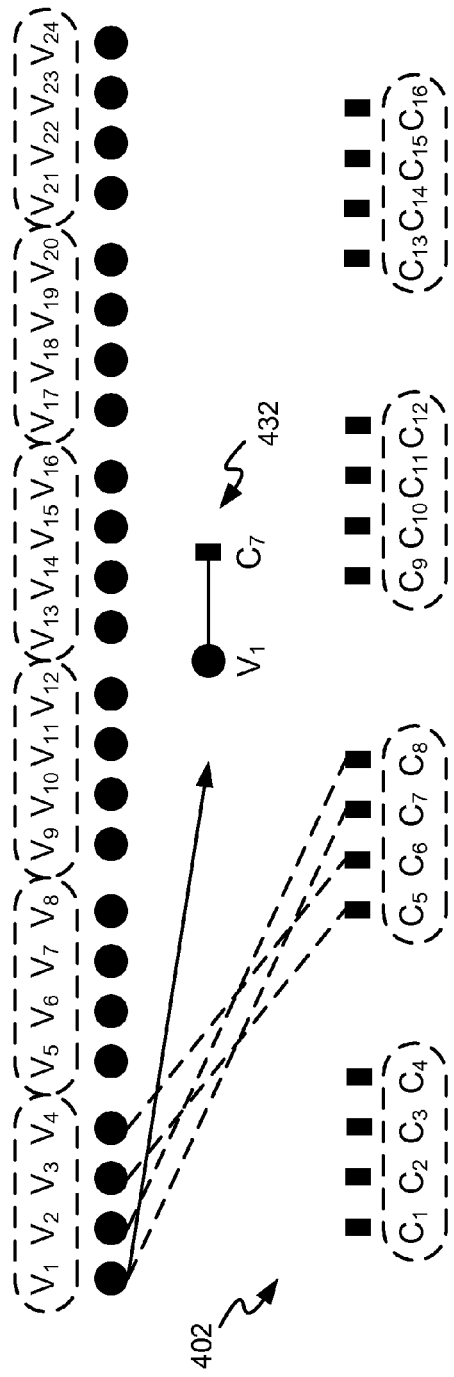
FIGS. 4*a*-4*t* show a process for quasi cyclic parity matrix construction in accordance with one or more embodiments of the present invention.
Figure 4D:
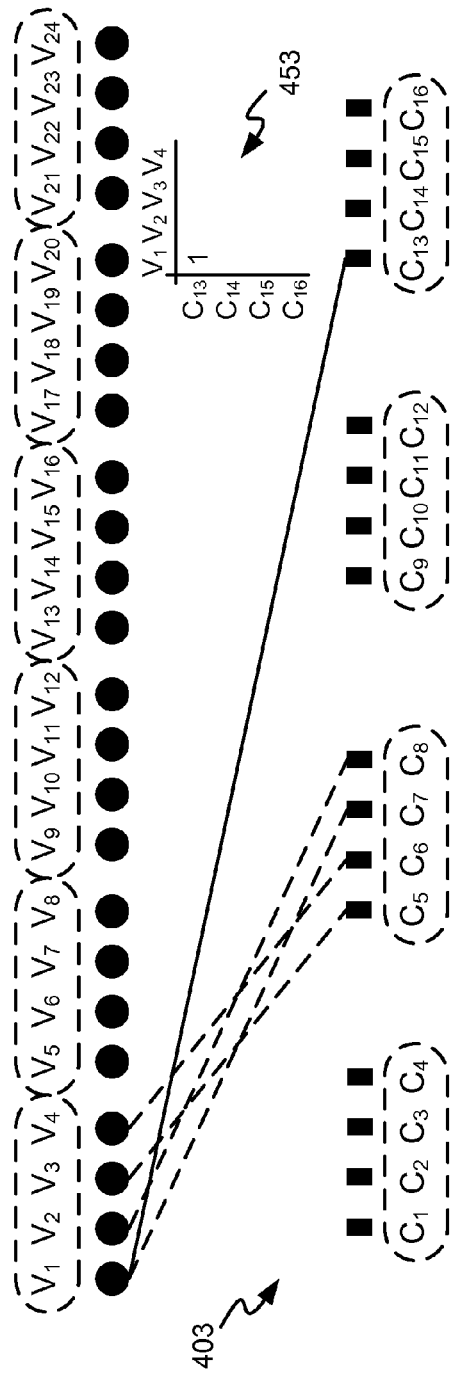
Figure 4I:
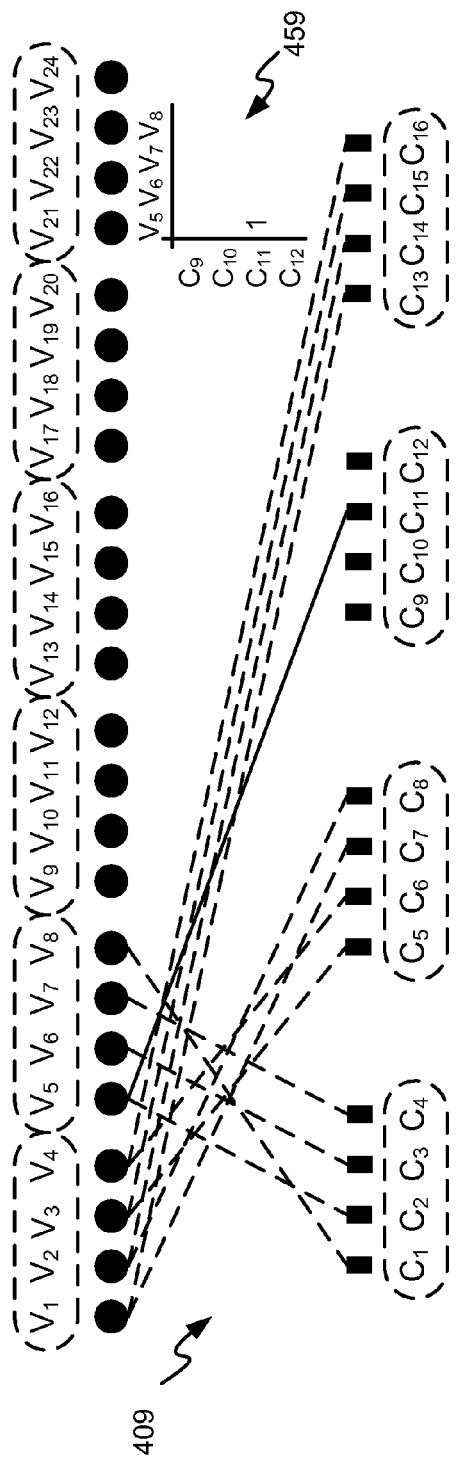
Figure 4J:
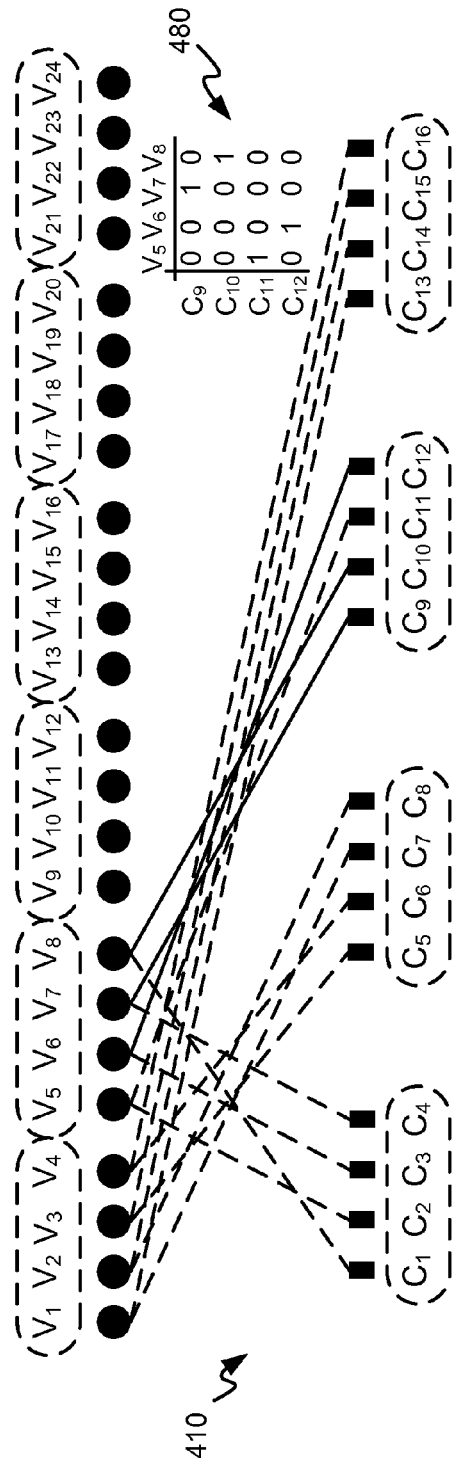
Figure 4K:
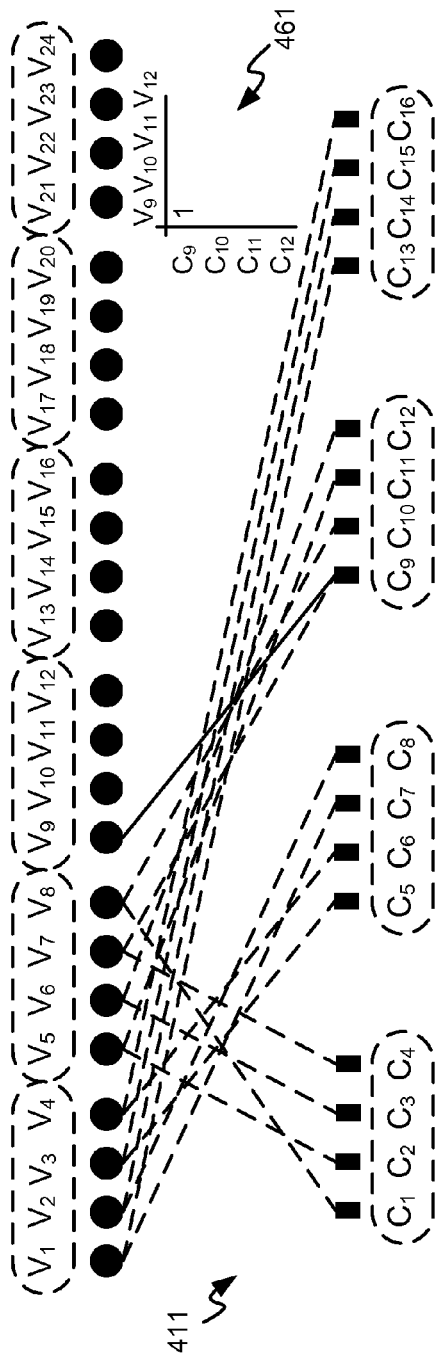
Figure 4L:
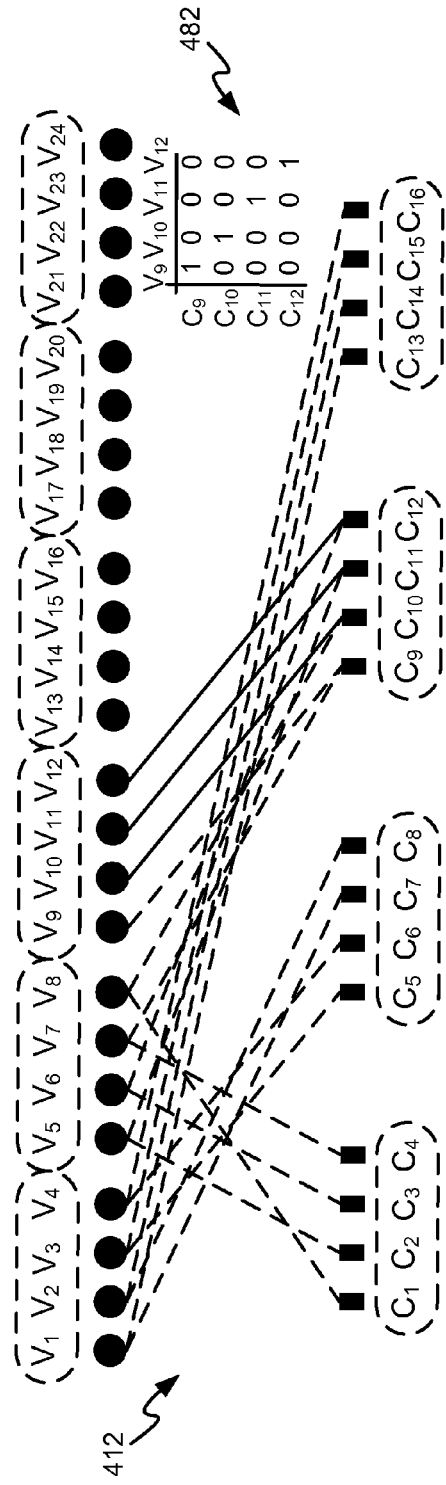
Figure 4O:
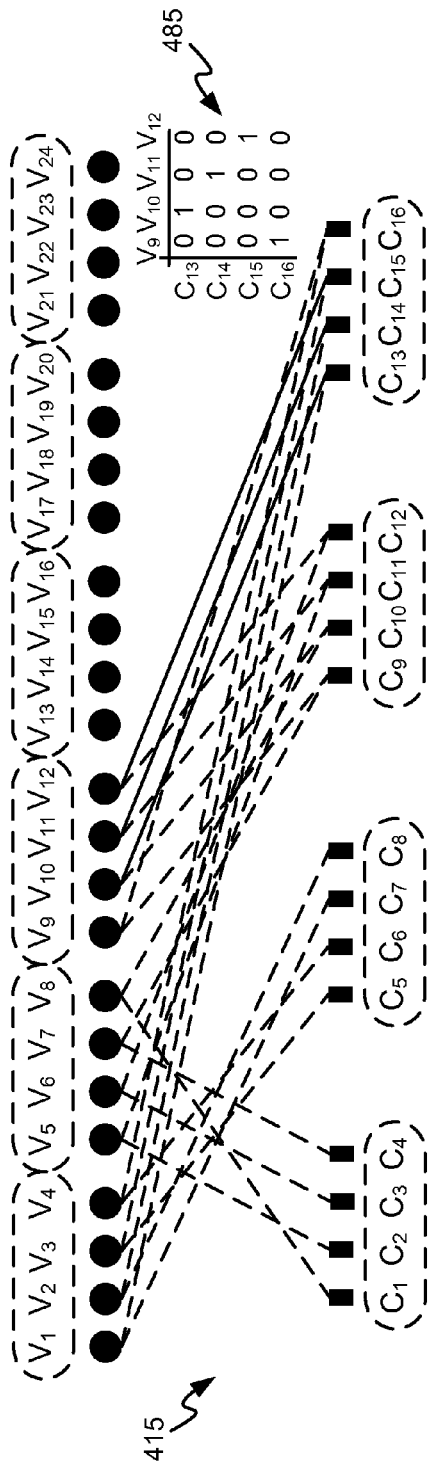
Figure 4P:
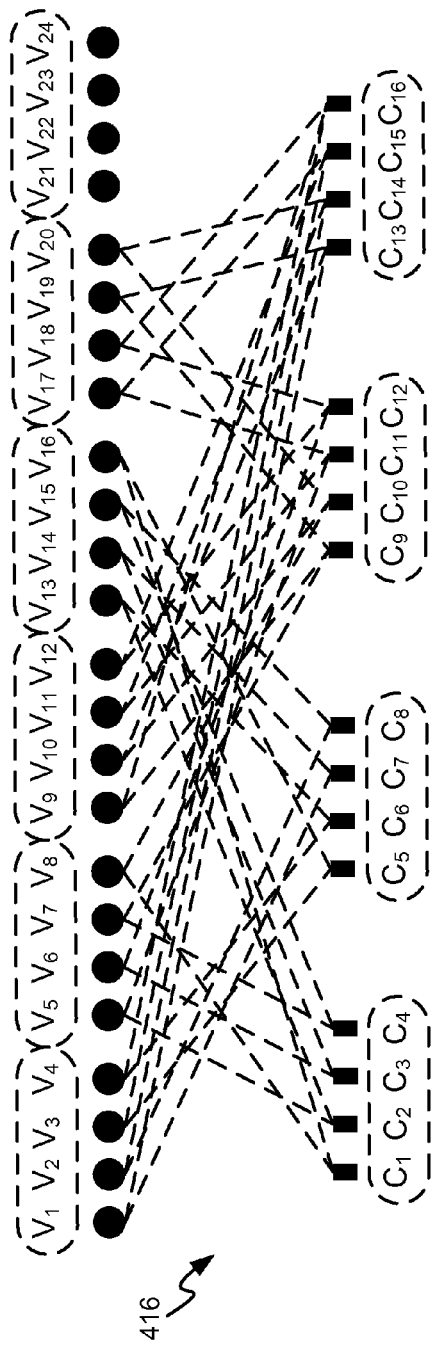
Figure 4Q:
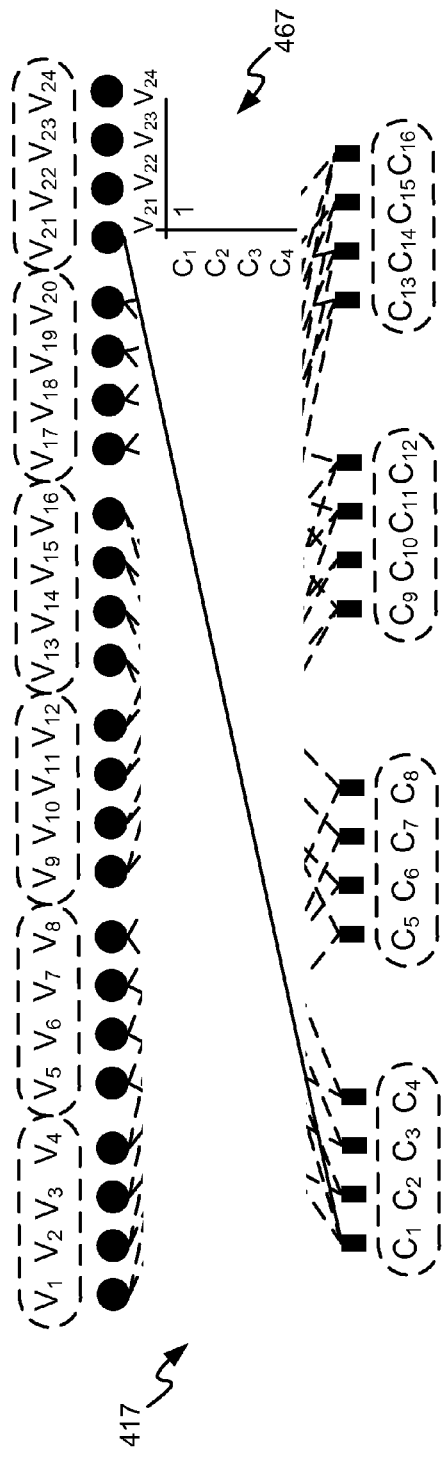
Figure 4R:
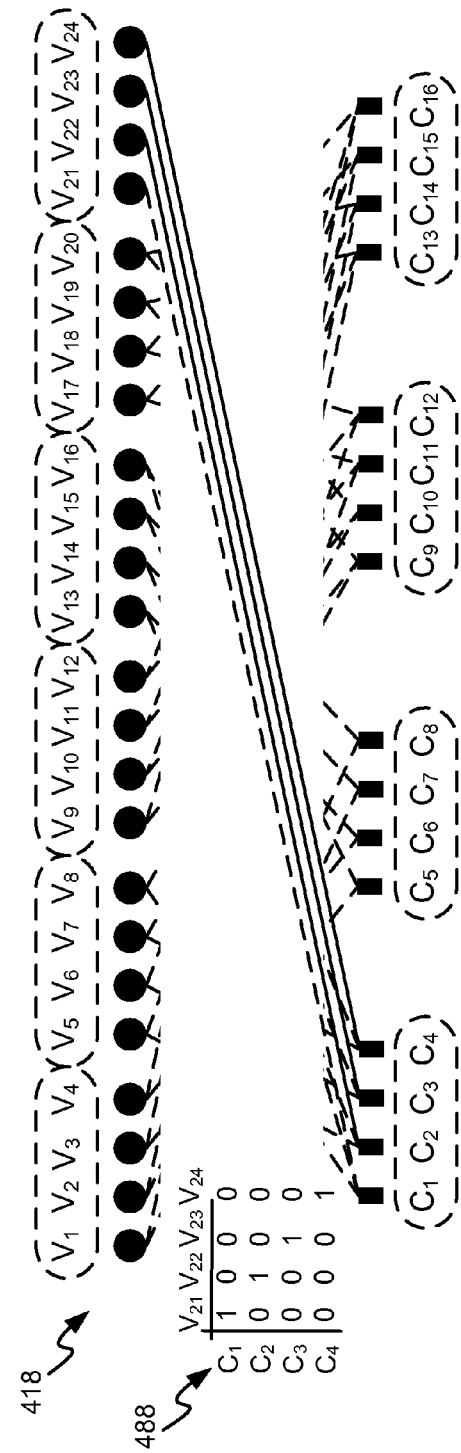
Figure 4S:
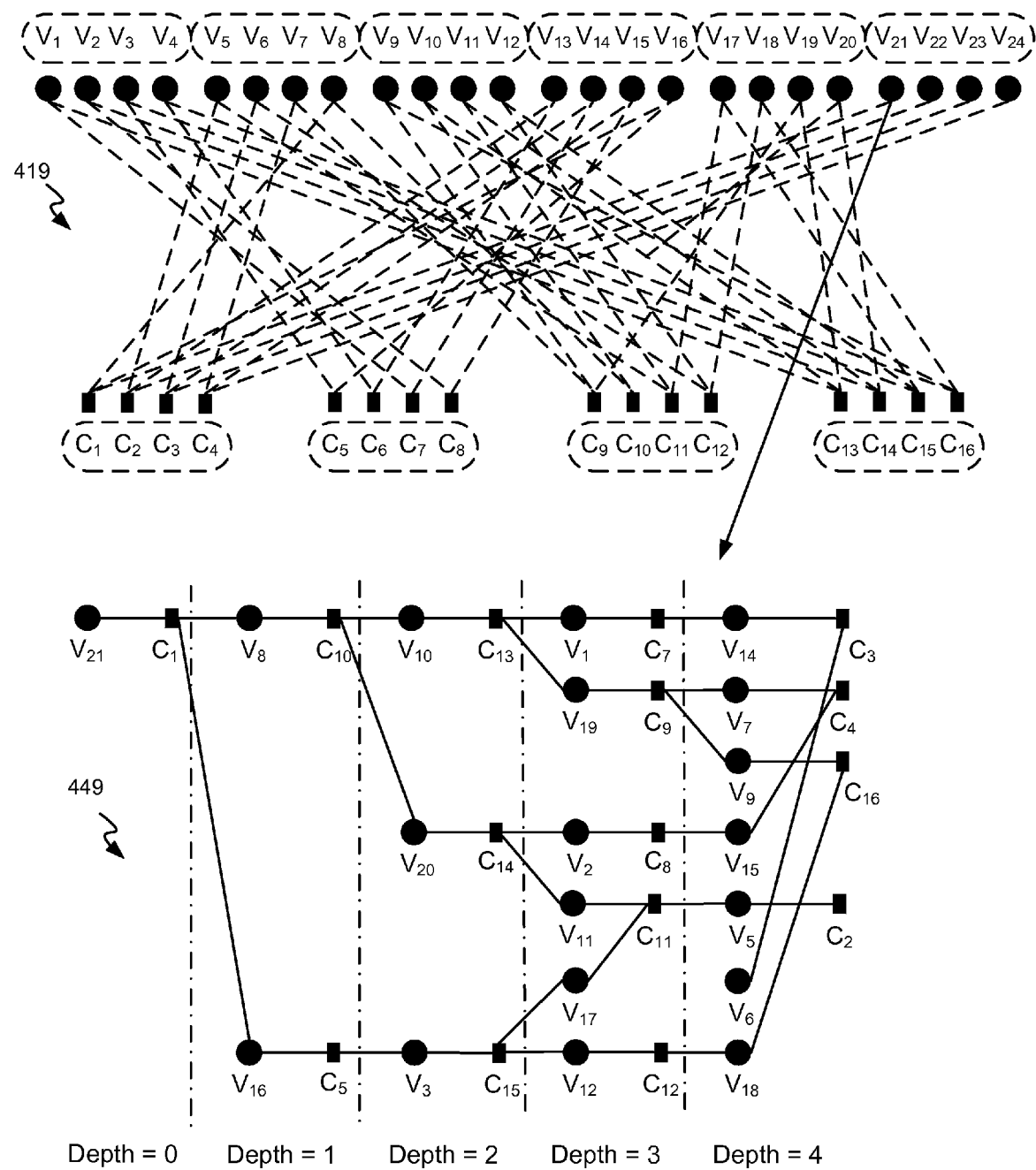
Figure 4T:
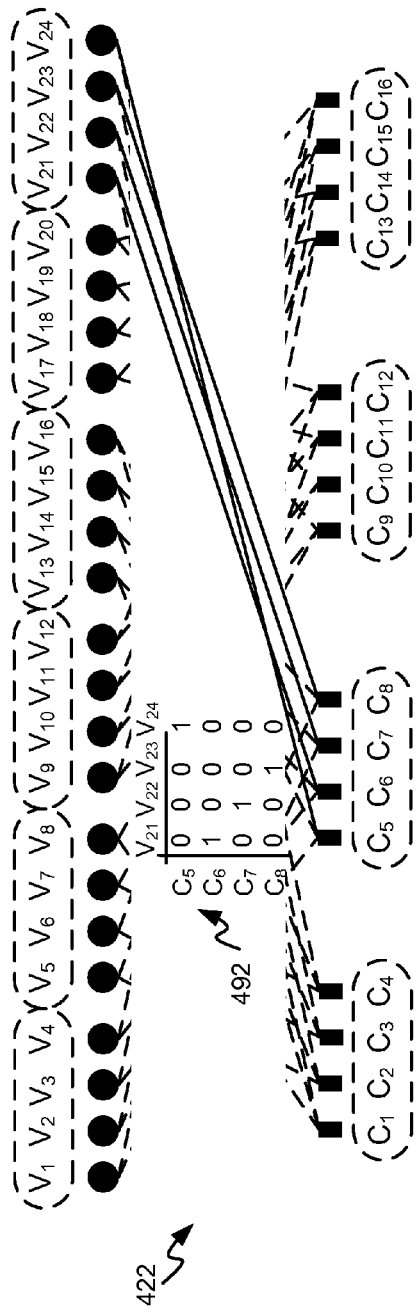

Turning to FIGS. 4a-4t an example of the processes of blocks 305-335 are performed in accordance with one or more embodiments of the present invention. The processes set forth in FIGS. 4a-4u are based upon a circulant size of 4×4, twenty-four variable nodes, sixteen check nodes, a variable degree of two, and a check degree of three. Based upon the disclosure provided herein, one of ordinary skill in the art will recognize a variety of other parameters that may be used in relation to different embodiments of the present invention. FIG. 4a is a Tanner graph 400 showing the process of block 305 and block 310 where variable node $V_1$ is selected, and a connection node with the lowest degree is selected for connection to variable node $V_1$. As shown, all of the connection nodes (i.e., $C_1$-$C_{16}$) are connected to the same number of variable nodes, and thus all have the same degree. In this case, connection node $C_7$ is selected. A partially filled matrix 450 shows the connection between $V_1$ and $C_7$ with a '1' in the connection location.

Next, turning to FIG. 4b, a Tanner graph 401 depicts the processes of block 315. In this case, matrix 450 is filled in to include the remaining connections by shifting the connection in row $C_7$ right to make row $C_8$, row $C_8$ is shifted right to make row $C_5$, and row $C_5$ is shifted right to make row $C_6$, This shifting results in a quasi-cyclic constraint 471. The connection of Tanner graph 400 are shown as a dashed line, and the other connections corresponding to quasi-cyclic constraint 471. The connection of Tanner graph 400 is shown as a dashed line, and the other connections corresponding to quasi-cyclic constraint 471 are shown as solid lines.

Next, turning to FIG. 4c, a Tanner graph 402 depicts the processes of block 320. In particular, a tree 432 is generated to determine another connection that is to be performed on variable node $V_1$. Tree 432 is generated by following all of the connections to variable node $V_1$. In this case, the only node that is connected to variable node $V_1$ is check node $C_7$. Thus, any check node other than $C_7$ may be used as the additional connection for variable node $V_1$. As shown in a Tanner graph 403 of FIG. 4d, check node $C_{13}$ is selected. A partially filled matrix 453 shows the connection between $V_1$ and $C_{13}$ with a '1' in the connection location. The connections of Tanner graph 401 are shown as dashed lines, and the other connection corresponding to partially filled matrix 453 is shown as a solid line.

Next, turning to a Tanner graph 405 of FIG. 4e, the processes of block 325 are shown including filling in matrix 453 to include the remaining connections by shifting the connection in row $C_{13}$ right to make row $C_{14}$, row $C_{14}$ is shifted right to make row $C_{15}$, and row $C_{16}$ is shifted right to make row $C_{16}$. This shifting results in a quasi-cyclic constraint 475, and Tanner graph 405 is updated to reflect connections in accordance with quasi-cyclic constraint 475. The connections of Tanner graph 403 are shown as dashed lines, and the other connections corresponding to quasi-cyclic constraint 475 are shown as solid lines.

Other variable nodes remain to be connected (i.e., other edges remain to be connected (block 330)). Accordingly, the aforementioned processes are repeated for the remaining nodes. Turning to FIG. 4f, a Tanner graph 406 shows the process of block 305 and block 310 where variable node $V_5$ is selected, and a connection node with the lowest degree is selected for connection to variable node $V_5$. As shown, any of connection nodes $C_1$-$C_4$ and $C_9$-$C_{16}$ are connected to the same number of variable nodes, and thus all have the same degree. In this case, connection node $C_2$ is selected for connection to variable node $V_5$. A partially filled matrix 456 shows the connection between $V_5$ and $C_2$ with a '1' in the connection location. The connections of Tanner graph 405 are shown as dashed lines, and the connection of $V_5$ and $C_2$ is shown as a solid line.

Next, turning to FIG. 4g, a Tanner graph 407 depicts the processes of block 315. In this case, matrix 456 is filled in to include the remaining connections by shifting the connection in row $C_2$ right to make row $C_3$, row $C_3$ is shifted right to make row $C_4$, and row $C_4$ is shifted right to make row $C_1$. This shifting results in a quasi-cyclic constraint 477. The connections of Tanner graph 406 are shown as dashed lines, and the connection of other connections corresponding to quasi-cyclic constraint 477 are shown as solid lines.

Next, turning to FIG. 4h, a Tanner graph 408 depicts the processes of block 320. In particular, a tree 438 is generated to determine another connection that is to be performed on variable node $V_5$. Tree 438 is generated by following all of the connections to variable node $V_5$. In this case, the only node that is connected to variable node $V_5$ is check node $C_2$. Thus, any check node other than $C_2$ may be used as the additional connection for variable node $V_5$. As shown in a Tanner graph 408 of FIG. 4i, check node $C_{11}$ is selected. A partially filled matrix 459 shows the connection between $V_5$ and $C_{11}$ with a '1' in the connection location. The connections of Tanner graph 408 are shown as dashed lines, and the other connection corresponding to partially filled matrix 459 is shown as a solid line.

Next, turning to a Tanner graph 410 of FIG. 4j, the processes of block 325 are shown including filling in matrix 459 to include the remaining connections by shifting the connection in row $C_{11}$ right to make row $C_{12}$, row $C_{12}$ is shifted right to make row $C_9$, and row $C_9$ is shifted right to make row $C_{10}$. This shifting results in a quasi-cyclic constraint 480, and Tanner graph 410 is updated to reflect connections in accordance with quasi-cyclic constraint 480. The connections of Tanner graph 409 are shown as dashed lines, and the other connections corresponding to quasi-cyclic constraint 480 are shown as solid lines.

Other variable nodes remain to be connected (i.e., other edges remain to be connected (block 330)). Accordingly, the aforementioned processes are repeated for the remaining nodes. Turning to FIG. 4k, a Tanner graph 411 shows the process of block 305 and block 310 where variable node $V_9$ is selected, and a connection node with the lowest degree is selected for connection to variable node $V_9$. As shown, all connection nodes (i.e., $C_1$-$C_{16}$) are connected to the same number of variable nodes (i.e., one), and thus all have the same degree. In this case, connection node $C_9$ is selected for connection to variable node $V_9$. A partially filled matrix 461 shows the connection between $V_9$ and $C_9$ with a '1' in the connection location. The connections of Tanner graph 410 are shown as dashed lines, and the connection of $V_9$ and $C_9$ is shown as a solid line.

Next, turning to FIG. 4l, a Tanner graph 412 depicts the processes of block 315. In this case, matrix 461 is filled in to include the remaining connections by shifting the connection in row $C_9$ right to make row $C_{10}$, row $C_{10}$ is shifted right to make row $C_{11}$, and row $C_{11}$ is shifted right to make row $C_{12}$. This shifting results in a quasi-cyclic constraint 482. The connections of Tanner graph 411 are shown as dashed lines, and the connection of other connections corresponding to quasi-cyclic constraint 482 are shown as solid lines.

Next, turning to FIG. 4m, a Tanner graph 413 depicts the processes of block 320. In particular, a tree 443 is generated to determine another connection that is to be performed on variable node $V_9$. Tree 443 is generated by following all of the connections to variable node $V_9$. In this case, the only nodes that are connected to variable node $V_9$ are check node $C_9$, variable node $V_7$, and check node $C_4$. Thus, any check node other than $C_9$ or $C_4$ may be used as the additional connection for variable node $V_5$. As shown in a Tanner graph 414 of FIG. 4n, check node $C_{16}$ is selected. A partially filled matrix 464 shows the connection between $V_9$ and $C_{16}$ with a '1' in the connection location. The connections of Tanner graph 413 are shown as dashed lines, and the other connection corresponding to partially filled matrix 464 is shown as a solid line.

Next, turning to a Tanner graph 415 of FIG. 4o, the processes of block 325 are shown including filling in matrix 464 to include the remaining connections by shifting the connection in row $C_{16}$ right to make row $C_{13}$, row $C_{13}$ is shifted right to make row $C_{14}$, and row $C_{14}$ is shifted right to make row $C_{15}$. This shifting results in a quasi-cyclic constraint 485, and Tanner graph 415 is updated to reflect connections in accordance with quasi-cyclic constraint 485. The connections of Tanner graph 414 are shown as dashed lines, and the other connections corresponding to quasi-cyclic constraint 485 are shown as solid lines.

Other variable nodes remain to be connected (i.e., other edges remain to be connected (block 330)), so the processes of blocks 305-335 are further repeated to complete the graph. A Tanner graph 416 is shown in FIG. 4p where the processes of blocks 305-325 have been repeated to complete the connection of all variable nodes, except variable nodes $V_{21}$-$V_{24}$. Turning to FIG. 4q, a Tanner graph 417 is shown with the center area of the graph whited out to allow the newly added connections to be more easily seen. In this case, the processes of blocks 305-310 are repeated where the previously non-affiliated variable node $V_{21}$ is selected. A connection node with the lowest degree is selected for connection to variable node $V_{21}$. As shown, any of connection nodes $C_1$-$C_4$ and $C_5$-$C_8$ are connected to the same number of variable nodes, and thus all have the same degree. In this case, connection node $C_1$ is selected for connection to variable node $V_{21}$. A partially filled matrix 467 shows the connection between $V_{21}$ and $C_1$ with a '1' in the connection location.

Next, turning to FIG. 4r, a Tanner graph 418 depicts the processes of block 315. In this case, matrix 467 is filled in to include the remaining connections by shifting the connection in row $C_1$ right to make row $C_2$, row $C_2$ is shifted right to make row $C_3$, and row $C_3$ is shifted right to make row $C_4$. This shifting results in a quasi-cyclic constraint 488. The connections of Tanner graph 417 are shown as dashed lines, and the connection of other connections corresponding to quasi-cyclic constraint 488 are shown as solid lines.

Next, turning to FIG. 4s, a Tanner graph 419 depicts the processes of block 320. In particular, a tree 449 is generated to determine another connection that is to be performed on variable node $V_{21}$. Tree 449 is generated by following all of the connections to variable node $V_{21}$. In this case, the only node that is not connected to variable node $V_{21}$ is check node $C_6$. Thus, only check node $C_6$ can be used as the additional connection for variable node $V_{21}$. As shown in a Tanner graph 419 of FIG. 4s, check node $C_6$ is selected. Next, turning to a Tanner graph 422 of FIG. 4t, the processes of block 325 are shown resulting in a quasi-cyclic constraint 492, and Tanner graph 422 is updated to reflect connections in accordance with quasi-cyclic constraint 492. The result of the connected Tanner graph is provided as a parity check matrix that may be used for LDPC decoding and encoding.

Figure 5A:
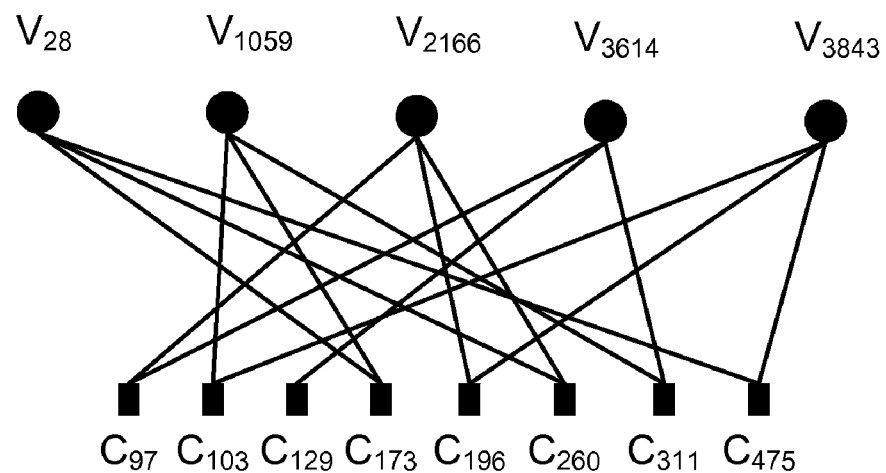
FIGS. 5*a*-5*b* show a process for trapping set mitigation in accordance with some embodiments of the present invention.
Figure 5B:
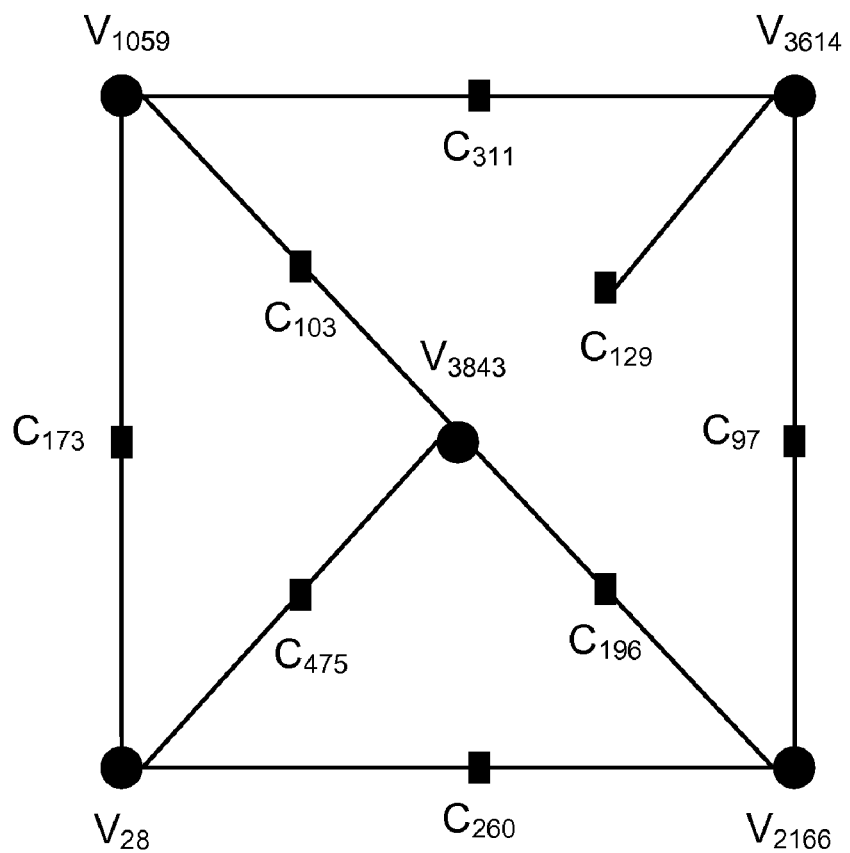

Turning to FIGS. 5a-5b an example of the processes of blocks 340-360 are performed in accordance with one or more embodiments of the present invention. Turning to FIG. 5a, an example set of connections from a portion 500 of a Tanner graph are depicted. In FIG. 5b, portion 510 is redrawn to show a number of short cycles within the Tanner graph. In some cases, a short cycle is defined as a cycle including six connections or fewer. In other cases, a short cycle is defined as including eight connections or fewer. In particular, by parsing the connections of the graphs, the following short cycles are identified (block 335):

(A) the cycle of $V_{28}$-$C_{173}$-$V_{1059}$-$C_{103}$-$V_{3843}$-$C_{475}$, that includes five connections;
(B) the cycle of $V_{28}$-$C_{173}$-$V_{1059}$-$C_{311}$-$V_{3614}$-$C_{97}$-$V_{2166}$-$C_{260}$, that includes seven connections;
(C) the cycle of $V_{28}$-$C_{173}$-$V_{1059}$-$C_{103}$-$V_{3843}$-$C_{196}$-$V_{2166}$-$C_{260}$, that includes seven connections; and
(D) the cycle of $V_{1059}$-$C_{103}$-$V_{3843}$-$C_{196}$-$V_{2166}$-$C_{97}$-$V_{3614}$-$C_{311}$, that includes seven connections.

A combination of any two of the aforementioned short cycles may comprise a trapping set. The variable node sets for each of the short cycles are identified as follows (block 340):

(A) node set $\{\{V_{28}, V_{1059}, V_{3843}\}\}$;
(B) node set $\{\{V_{28}, V_{1059}, V_{3614}, V_{2166}\}\}$;
(C) node set $\{\{V_{28}, V_{1059}, V_{3843}, V_{2166}\}\}$; and
(D) node set $\{\{V_{1059}, V_{3843}, V_{2166}, V_{3614}\}\}$.

A checksum for each of the aforementioned node sets is then calculated (block 345). These checksums are then compared with a programmable threshold value (block 350). Where the threshold is not met, mitigation of the trapping set is performed. This mitigation is done by re-performing one or more of the connections discussed above in relation to FIGS. 4a-4t. In particular, when connection of a variable node allows for selection of more than one check node, a check node that increases the number of connections and/or increases the checksum is selected. In this way, some dominant trapping sets may be avoided.

The aforementioned approach for trapping set optimization may be used to mitigate the effects of trapping sets by avoiding some of the more problematic trapping sets. Such an approach works very efficiently for low column weight low density parity check codes (i.e., codes with a column weight less than or equal to four). In some cases, code design using the aforementioned trapping set mitigation may be done without increases to hardware decoders or encoders, and yet produce a reduction in the error floor. This is particularly true where irregular low density parity check codes are used.

Figure 6:
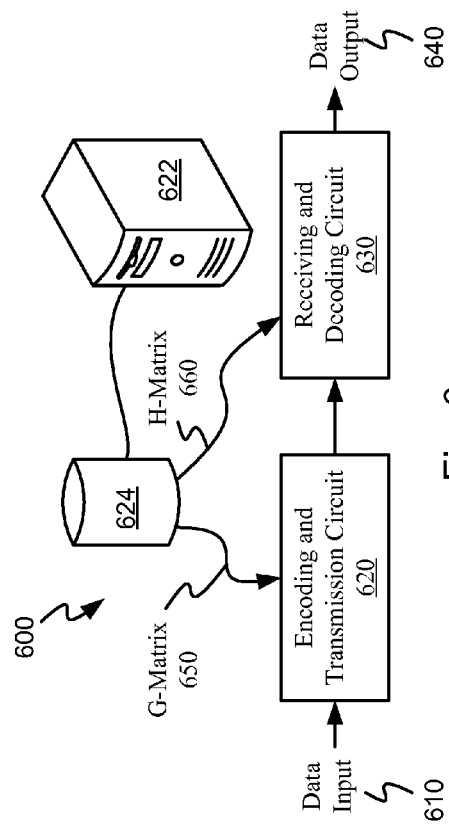
FIG. 6 shows a data processing system in accordance with various embodiments of the present invention.

Turning to FIG. 6, a data processing system 600 is shown in accordance with various embodiments of the present invention. Data processing system 600 includes a processor 622 that is communicably coupled to a computer readable medium 624. As used herein, the phrase "computer readable" medium is used in its broadest sense to mean any medium or media capable of holding information in such a way that it is accessible by a computer processor. Thus, a computer readable medium may be, but is not limited to, a magnetic disk drive, an optical disk drive, a random access memory, a read only memory, an electrically erasable read only memory, a flash memory, or the like. Based upon the disclosure provided herein, one of ordinary skill in the art will recognize a variety of computer readable mediums and/or combinations thereof that may be used in relation to different embodiments of the present invention. Computer readable medium 624 includes instructions executed by processor 622 to produce a G-matrix 650 and a corresponding H-matrix 660 in accordance with the approach discussed above in relation to FIG. 3 and FIG. 4. G-matrix 650 is provided to an encoding and transmission circuit 620 that encodes a data input 610 using G-matrix 610 to produce a codeword. H-matrix 660 is provided to a receiving and decoding circuit 630 that decodes the codeword using H-matrix 660 to provide a data output 640.

In conclusion, the invention provides novel systems, devices, methods and arrangements for quasi-cyclic low density parity check data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for data processing, the method comprising:
generating a parity check matrix, wherein generating the parity check matrix includes:
selecting a non-affiliated variable node, wherein the non-affiliated variable node is not connected to a check node;
identifying a check node of the lowest degree;
connecting a first edge of the non-affiliated variable node to the identified check node; and
connecting one or more additional edges of the non-affiliated variable node to check nodes in accordance with a quasi-cyclic constraint associated with a circulant.

2. The method of claim 1, wherein the parity check matrix is a G-matrix, and wherein the method further comprises:
providing the G-matrix to an encoding circuit; and
matrix multiplying the G-matrix by a user data set in the encoding circuit to yield a codeword.

3. The method of claim 1, wherein the parity check matrix is an H-matrix, and wherein the method further comprises:
providing a decoding circuit;
receiving a codeword; and
decoding the codeword, wherein decoding the codeword includes matrix multiplying the H-matrix by the user data set in the decoding circuit.

4. The method of claim 1, wherein the circulant is a first circulant, and wherein the method further comprises:
generating a tree from the non-affiliated variable node to determine a second circulant to be associated with the non-affiliated node.

5. The method of claim 4, wherein the method further comprises:
identifying a check node of the second circulant having the lowest degree; and
connecting the identified check node to the non-affiliated variable node.

6. The method of claim 5, wherein the method further comprises:
connecting one or more additional edges of the non-affiliated variable node to other check nodes of the second circulant in accordance with a quasi-cyclic constraint associated with the second circulant.

7. The method of claim 6, wherein the non-affiliated variable node is one of a number of variable nodes, and wherein the method further comprises:
applying trapping set mitigation to the connections between the variable nodes and the check nodes.

8. The method of claim 7, wherein the trapping set mitigation comprises:
identifying path lengths associated with the connections between the variable nodes and the check nodes.

9. The method of claim 8, wherein the trapping set mitigation further comprises:
selecting one or more short path lengths between the variable nodes and the check nodes; and
reconnecting the one or more short path lengths to yield longer path lengths.

10. A system for generating a trapping set reduced parity check matrix, the system comprising:
a processor;
a non-transitory computer readable medium, wherein the computer readable medium is accessible to the processor, and wherein the computer readable medium includes instructions executable by the processor to:
select a non-affiliated variable node, wherein the non-affiliated variable node is not connected to a check node;
identify a check node of the lowest degree;
connect a first edge of the non-affiliated variable node to the identified check node; and
connect one or more additional edges of the non-affiliated variable node to check nodes in accordance with a quasi-cyclic constraint associated with a circulant.

11. The system of claim 10, wherein the instructions are further executable by the processor to:
generate a G-matrix including the connection of the edges of the non-affiliated variable node; and
generate an H-matrix corresponding to the G-matrix.

12. The system of claim 10, wherein the circulant is a first circulant, and wherein the method further comprises:
generating a tree from the non-affiliated variable node to determine a second circulant to be associated with the non-affiliated node.

13. The system of claim 12, wherein the instructions are further executable by the processor to:
identify a check node of the second circulant having the lowest degree; and
connect the identified check node to the non-affiliated variable node.

14. The system of claim 13, wherein the instructions are further executable by the processor to:
connect one or more additional edges of the non-affiliated variable node to other check nodes of the second circulant in accordance with a quasi-cyclic constraint associated with the second circulant.

15. The system of claim 14, wherein the non-affiliated variable node is one of a number of variable nodes, and wherein the instructions are further executable by the processor to:
apply trapping set mitigation to the connections between the variable nodes and the check nodes.

16. The system of claim 15, wherein the instructions are further executable by the processor to:
identify path lengths associated with the connections between the variable nodes and the check nodes.

17. The system of claim 16, wherein the instructions are further executable by the processor to:
select one or more short path lengths between the variable nodes and the check nodes; and
reconnect the one or more short path lengths to yield longer path lengths.

18. A method for creating a parity check matrix, the method comprising:
providing a number of variable nodes;
providing a number of check nodes;
selecting one of the variable nodes;
identifying a check node of the lowest degree, wherein the check node is associated with a first circulant;
connecting a first edge of the one of the variable nodes to the identified check node;
connecting one or more additional edges of the one of the variable nodes to check nodes in accordance with a quasi-cyclic constraint of the first circulant;
generating a tree from the one of the variable nodes to determine a second circulant to be associated with the one of the variable nodes;
identifying a check node of the second circulant having the lowest degree; and
connecting the identified check node to the non-affiliated variable node.

19. The method of claim 18, wherein the method further comprises:
connecting one or more additional edges of the one of the variable nodes to other check nodes of the second circulant in accordance with a quasi-cyclic constraint associated with the second circulant.

20. The method of claim 19, wherein the method further comprises:
applying trapping set mitigation to the connections between the variable nodes and the check nodes, wherein the trapping set mitigation includes:
identifying path lengths associated with the connections between the variable nodes and the check nodes;
selecting one or more short path lengths between the variable nodes and the check nodes; and
reconnecting the one or more short path lengths to yield longer path lengths.

* * * * *